United States Patent [19]
Shepherd et al.

[11] 4,194,199
[45] Mar. 18, 1980

[54] DISPLAY APPARATUS

[75] Inventors: Brian Shepherd, Witney; Richard N. Thomas, Weybridge, both of England

[73] Assignee: Smiths Industries Limited, London, England

[21] Appl. No.: 784,304

[22] Filed: Apr. 4, 1977

[30] Foreign Application Priority Data

Apr. 6, 1976 [GB] United Kingdom ............... 13987/76

[51] Int. Cl.² .............................................. G06F 3/14
[52] U.S. Cl. .................................. 340/754; 340/756; 340/789; 340/52 F
[58] Field of Search ............. 340/324 R, 324 M, 336, 340/166 EL, 52 R, 52 F, 166 EL, 706, 753, 754, 756, 789

[56] References Cited

U.S. PATENT DOCUMENTS

| | | | |
|---|---|---|---|
| 3,898,642 | 8/1975 | Dorey et al. | 340/336 |
| 3,914,758 | 10/1975 | Ingle | 340/336 |
| 3,918,041 | 11/1975 | Mao | 340/324 R |
| 3,934,241 | 1/1976 | Weigert | 340/166 EL |
| 3,950,743 | 4/1976 | Hatano et al. | 340/336 |
| 3,987,617 | 10/1976 | Slob | 340/324 M |

*Primary Examiner*—Marshall M. Curtis
*Attorney, Agent, or Firm*—Pollock, Vande Sande and Priddy

[57] ABSTRACT

A display apparatus for displaying a plurality of physical parameters has a plurality of electrically-operable display regions which are to be operated in accordance with respective physical parameters. The display regions each comprise a plurality of display sections disposed in spaced array, an electrode which is common to all display sections in that display region, and a plurality of individual electrodes associated with individual and respective ones of the display sections in that display region. The electrodes of the said plurality of individual electrodes associated with one display region are coupled to respective ones of the said plurality of individual electrodes associated with another display region to form respective groups of electrodes. The display apparatus includes electric circuit means for operating the display regions in accordance with the values of the respective physical parameters, the circuit means being arranged sequentially to energize the said groups of electrodes and simultaneously to energize the said common electrodes in accordance with the values of the respective physical parameters.

17 Claims, 10 Drawing Figures

Fig. 4.

| FE NO. | SPEEDOMETER | | | | | TACHOMETER | | | WATER TEMP. GAUGE BE9 | FUEL GAUGE BE10 | WARNING LAMPS BE11 | ODOMETER | | | | |
|---|---|---|---|---|---|---|---|---|---|---|---|---|---|---|---|---|
| | BE1 | BE2 | BE3 | BE4 | BE5 | BE6 | BE7 | BE8 | | | | BE12 | BE13 | BE14 | BE15 | BE16 |
| 1 | 1 | 20 | 21 | 40 | 41 | 1 | 20 | 21 | 40 | 41 | 1,20,21,40,41 | 1 | 20 | 21 | 40 | 41 |
| 2 | 2 | 19 | 22 | 39 | 42 | 2 | 19 | 22 | 39 | 42 | 2,19,22,39,42 | 2 | 19 | 22 | 39 | 42 |
| 3 | 3 | 18 | 23 | 38 | 43 | 3 | 18 | 23 | 38 | 43 | 3,18,23,38,43 | 3 | 18 | 23 | 38 | 43 |
| 4 | 4 | 17 | 24 | 37 | 44 | 4 | 17 | 24 | 37 | 44 | 4,17,24,37,44 | 4 | 17 | 24 | 37 | 44 |
| 5 | 5 | 16 | 25 | 36 | 45 | 5 | 16 | 25 | 36 | 45 | 5,16,25,36,45 | 5 | 16 | 25 | 36 | 45 |
| 6 | 6 | 15 | 26 | 35 | 46 | 6 | 15 | 26 | 35 | 46 | 6,15,26,35,46 | 6 | 15 | 26 | 35 | 46 |
| 7 | 7 | 14 | 27 | 34 | 47 | 7 | 14 | 27 | 34 | 47 | 7,14,27,34,47 | 7 | 14 | 27 | 34 | 47 |
| 8 | 8 | 13 | 28 | 33 | 48 | 8 | 13 | 28 | 33 | 48 | 8,13,28,33,48 | — | — | — | — | — |
| 9 | 9 | 12 | 29 | 32 | 49 | 9 | 12 | 29 | 32 | 49 | 9,12,29,32,49 | — | — | — | — | — |
| 10 | 10 | 11 | 30 | 31 | 50 | 10 | 11 | 30 | 31 | 50 | 10,11,30,31,50 | — | — | — | — | — |

Fig.9.

| F.E NO. | SPEEDOMETER | | | | | TACHOMETER | | | WATER TEMP GAUGE BE9. | FUEL GAUGE BE10. |
|---|---|---|---|---|---|---|---|---|---|---|
| | BE1. | BE2. | BE3. | BE4. | BE5. | BE6. | BE7. | BE8. | | |
| 1 | 1 | 11 | 21 | 31 | 41 | 1 | 11 | 21 | 31 | 41 |
| 2 | 2 | 12 | 22 | 32 | 42 | 2 | 12 | 22 | 32 | 42 |
| 3 | 3 | 13 | 23 | 33 | 43 | 3 | 13 | 23 | 33 | 43 |
| 4 | 4 | 14 | 24 | 34 | 44 | 4 | 14 | 24 | 34 | 44 |
| 5 | 5 | 15 | 25 | 35 | 45 | 5 | 15 | 25 | 35 | 45 |
| 6 | 6 | 16 | 26 | 36 | 46 | 6 | 16 | 26 | 36 | 46 |
| 7 | 7 | 17 | 27 | 37 | 47 | 7 | 17 | 27 | 37 | 47 |
| 8 | 8 | 18 | 28 | 38 | 48 | 8 | 18 | 28 | 38 | 48 |
| 9 | 9 | 19 | 29 | 39 | 49 | 9 | 19 | 29 | 39 | 49 |
| 10 | 10 | 20 | 30 | 40 | 50 | 10 | 20 | 30 | 40 | 50 |

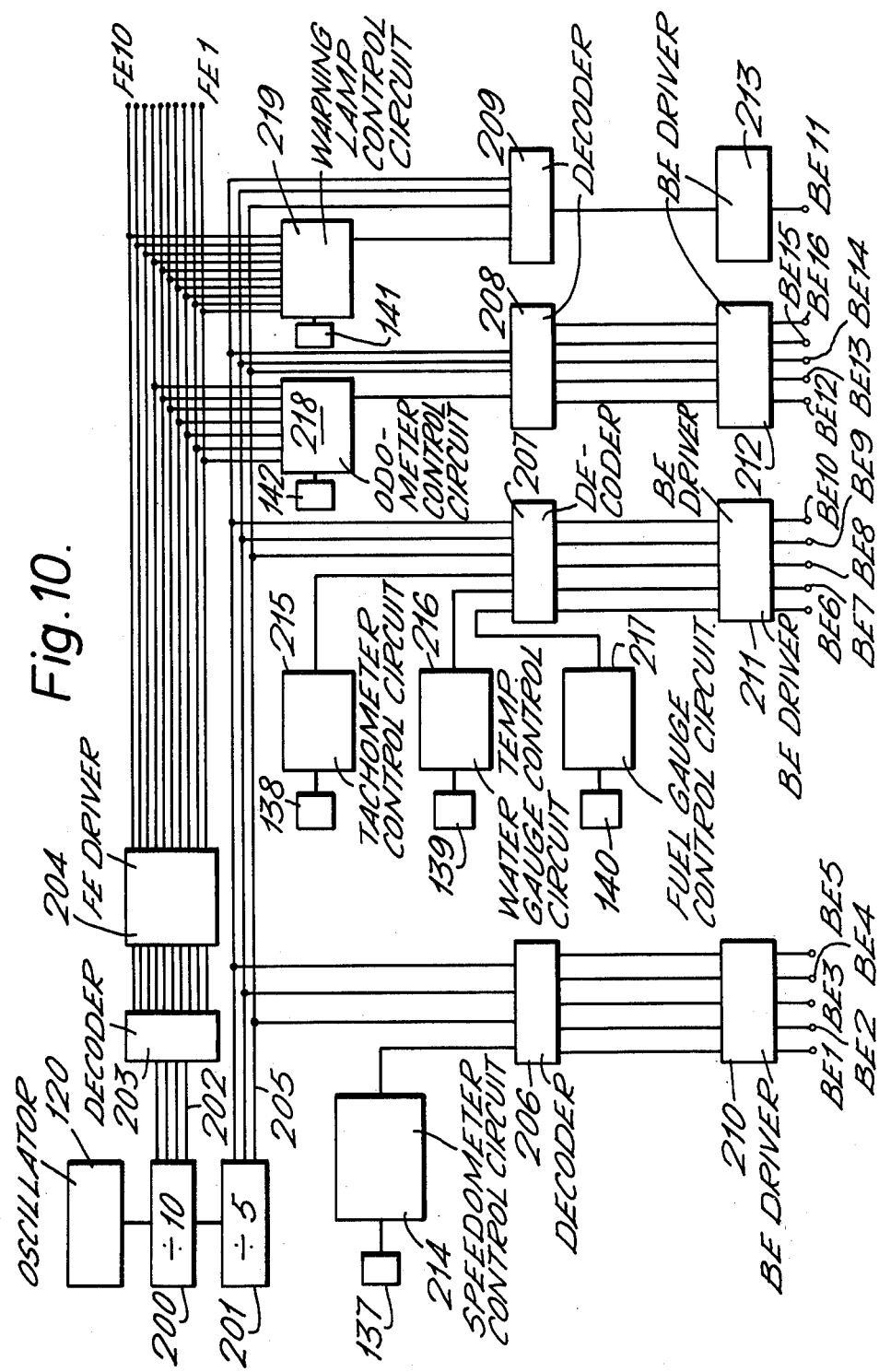

DISPLAY APPARATUS

This invention relates to display apparatus, and is more particularly concerned with solid state instrument panels for vehicles.

According to this invention there is provided display apparatus for displaying a plurality of physical parameters, wherein each of a plurality of electrically-operable display regions which are to be operated in accordance with respective physical parameters comprises a plurality of display sections disposed in spaced array, an electrode which is common to all display sections in that display region, and a plurality of individual electrodes associated with individual and respective ones of the display sections in that display region, wherein the electrodes of the said plurality of individual electrodes associated with one display region are coupled to respective ones of the said plurality of individual electrodes associated with another display region to form respective groups of electrodes, and wherein circuit means is arranged sequentially to energize the said groups of electrodes, and simultaneously to energize the said common electrodes in accordance with the values of the respective physical parameters.

Various forms of display apparatus in accordance with this invention, incorporating an electrically-operable instrument panel for a motor vehicle, will now be described, by way of example, with reference to the accompanying drawings, in which:

FIG. 4 is a table showing the sequence of operation of the displays shown in FIG. 1;

FIG. 9 is a table showing the sequence of operation of the displays shown in FIG. 1 when using the pattern of electrodes of FIG. 8; and FIG. 10 is a block schematic diagram of a circuit for operating the pattern of electrodes of FIG. 2 as modified by the pattern of electrodes shown in FIG. 8.

The electrically-operable instrument panel to be described includes a d.c. electroluminescent display device. The basic construction and operation of such devices is well known, and therefore will only be described here briefly.

An electroluminescent device has a layer of electroluminescent material sandwiched between a sheet of transparent, insulating material such as glass and a conductive sheet of, for example, aluminum. The glass sheet carries a pattern of transparent tin-oxide electrodes aligned with apertures in an insulating mask which separates the glass sheet from the electroluminescent material. The mask apertures may define alphanumeric characters and other symbols. The aluminum sheet is divided into electrically-isolated areas to provide a second set of electrodes arranged so that each surface of any area of the electroluminescent material which is to be energized is in contact with a respective one of the tin-oxide electrodes and a respective one of the aluminum electrodes. Thus any particular area can be made to emit light through the glass front sheet by selectively energizing its associated electrodes.

Figure 1:
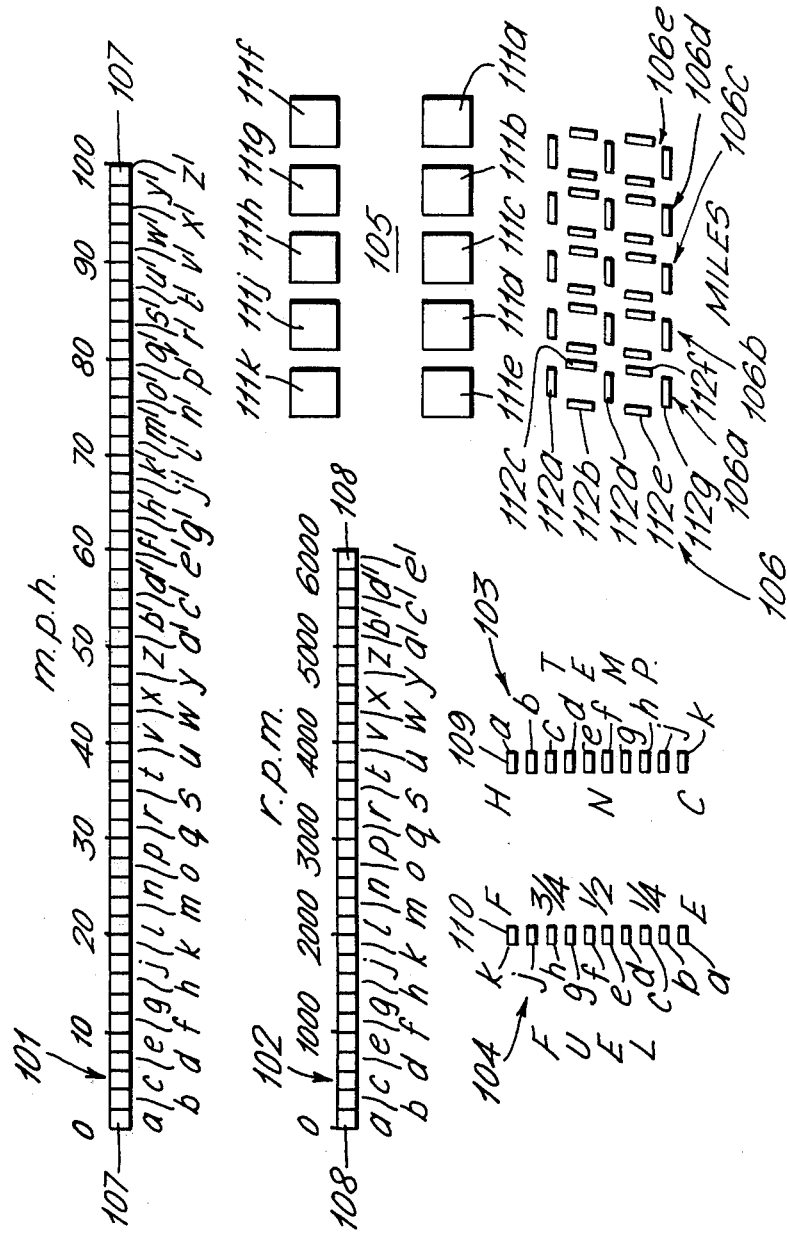
FIG. 1 shows the disposition of displays in the panel.

Referring to FIG. 1, the electroluminescent device in this case contains six displays: a speedometer 101, a tachometer 102, a water temperature gauge 103, a fuel gauge 104, a warning light cluster 105 and a five-digit odometer 106.

The speedometer 101 comprises fifty separate display sections 107a to 107z and 107a' to 107z' disposed adjacent one another along a path, which in the device illustrated is straight but could instead, for example, be circular or arcuate. Each section 107 indicates an incremental speed of 2 miles per hour, and any speed in the range 0 to 100 miles per hour may be indicated by energization of an appropriate number of the sections 107. For example, to indicate a speed of 42 miles per hour, the first twenty-one sections 107a to 107v would be energized.

The tachometer 102 has thirty separate display sections 108a to 108z and 108a' to 108e' which are operable in the same manner as the sections 107 in the speedometer 101 to provide an indication of engine speed ranging from 0 to 6000 revolutions per minute.

The water temperature gauge 103 and the fuel gauge 104 each have ten display sections, referenced 109a to 109k and 110a to 110k respectively in FIG. 1. These gauges 103 and 104 also operate in the same manner as the speedometer 101 to give an indication, in general terms, of the magnitude of their respective parameters.

Ten display sections 111a to 111k are provided in the warning light cluster 105. Each section 111 is individually operable to indicate the status of an associated operational parameter of the vehicle.

The odometer 106 comprises five digits 106a to 106e, each of which has seven display sections 112a to 112g arranged in a conventional seven-segment digit-display format. Thus any digit from 0 to 9 can be displayed at each digit position by selective energization of the sections 112 at that position. For example, the display sections 112c and 112f are energized to display the digit 1, the display sections 112a, 112c, 112d, 112e and 112g are energized to display the digit 2, and so on.

If a single, common electrode were provided on the rear sheet of the electroluminescent display device, and the individual ones of the display sections 107 to 112 were provided by respective and individual electrodes on the front sheet of the display device, a total of one hundred and forty-six electrodes would be required. Such a large number of electrodes would be difficult to interconnect reliably with the electronic circuitry for operating the display device. Accordingly, in accordance with the present invention the individual display sections 107 to 112 are interconnected in groups by their electrodes to permit multiplex operation of the display sections. The particular form of interconnection adopted permits the number of external connections to the display device to be reduced to twenty-six, ten external connections for the tin-oxide electrodes on the front sheet and sixteen external connections for the aluminum electrodes on the back sheet.

Figure 2:
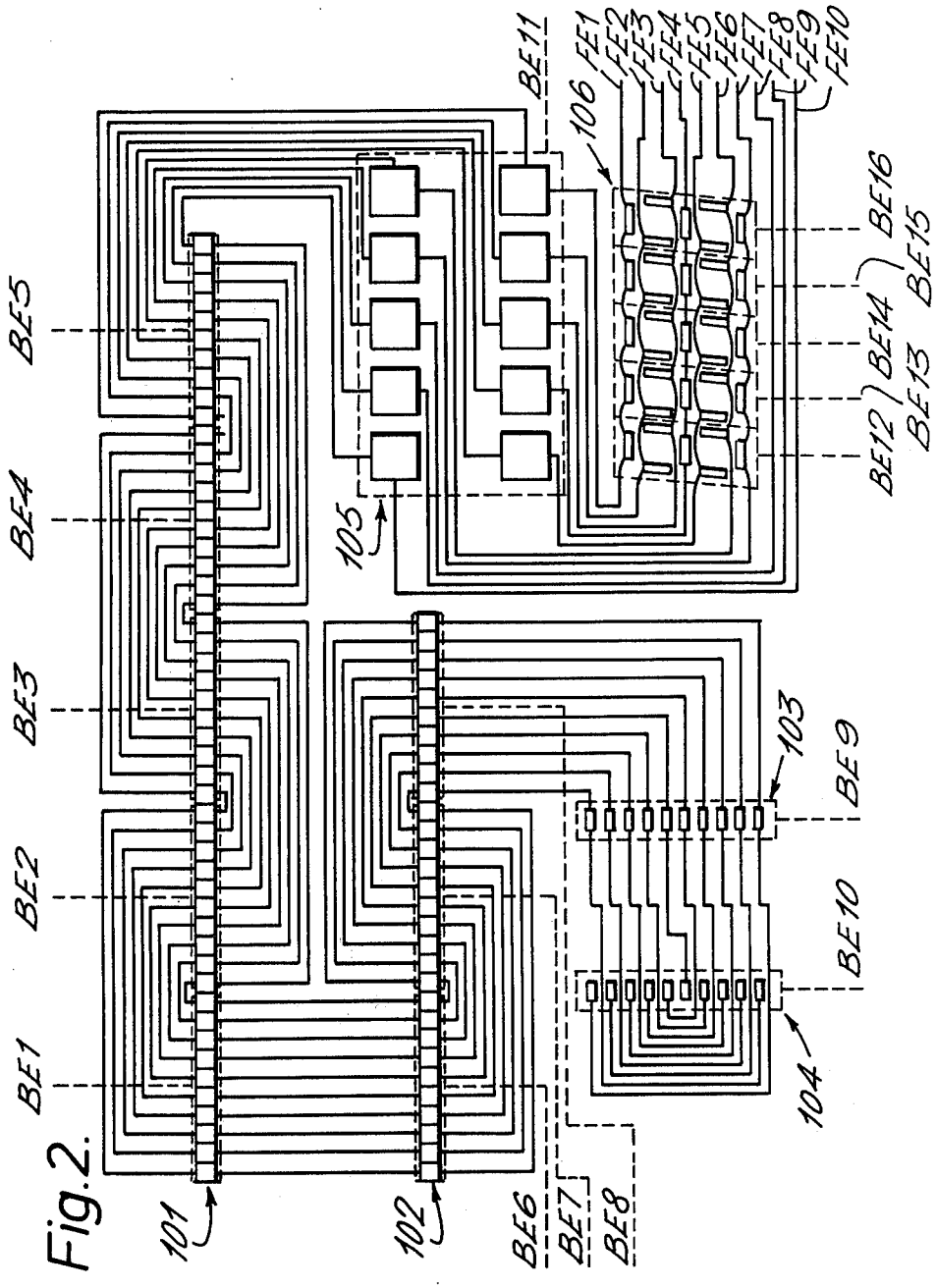
FIG. 2 shows one pattern of electrodes for energizing the displays shown in FIG. 1.

The pattern of electrodes for the display device is shown in FIG. 2, with the tin-oxide electrodes on the front sheet being drawn in solid lines and the aluminum electrodes on the back sheet being drawn in broken lines.

The front sheet carries ten tin-oxide electrodes FE1 to FE10 which contact the front surfaces of the areas of electroluminescent material forming the display sections 107 to 112, and the back sheet carries sixteen aluminum electrodes BE1 to BE16 which contact the back surfaces of these areas. Each electrode BE1 to BE16 is associated with only one of the six displays 101 to 106, and overlies and thus interconnects a respective group of adjacent ones of the display sections 107 to 112. More particularly, the electrodes BE1 to BE11 each interconnect respective groups of ten adjacent ones of the display sections 107 to 111, while the electrodes BE12 to BE16 each interconnect respective groups of seven of the display sections 112, each group of seven display sections 112 comprising those of the display sections 112 for providing an individual one of the digits of the odometer 106. On the other hand, the electrodes FE1 to FE10 are associated with all the displays, with each of the electrodes FE1 to FE7 being coupled to respective ones of the sections 107 to 112 in each one of the groups defined by the electrodes BE1 to BE16, and the electrodes FE8 to FE10 being coupled only to respective ones of the display sections 107 to 110 in each one of the groups defined by the electrodes BE1 to BE11.

Thus, comparing FIGS. 1 and 2, the electrode BE1 is coupled to ten sections 107a to 107k of the speedometer 101, the electrode BE2 is coupled to the next ten sections 107l to 107u of the speedometer, and so on. Similarly, the electrode BE6, for example, is coupled to the ten sections 108a to 108k of the tachometer 102. The electrodes BE9, BE10 and BE11 are coupled to, respectively, all the sections 109 of the water temperature gauge 103, all the sections 110 of the fuel gauge 104 and all the sections 111 of the warning light cluster 105. In the case of the odometer 106, the electrodes BE12 to BE16 are coupled to all seven sections 112 of respective digits 106a to 106e.

Each of the electrodes BE1 to BE16 shown in FIG. 2 consists of a single area of aluminium. However, they may alternatively be formed by a series of smaller areas, one for each display section, which are appropriately electrically connected to one another.

Considering now the electrode FE1, for example, this interconnects the sections 112a of each of the odometer digits 106a to 106e; the section 111a of the warning light cluster 105; the sections 107q', 107p', 107v, 107u and 107a of the speedometer 101, the sections 108a, 108u and 108v of the tachometer 102; the section 109a of the water temperature gauge 103 and the section 110a of the fuel gauge 104. Similarly, the electrode FE10, which is not coupled to the odometer 106, interconnects the sections 111k; 107z', 107f', 107e', 107l and 107k; 108k, 108l and 108e'; 109k and 110k.

It will be noted that adjacent groups of ten of the display sections 107 and 108 are interconnected by the electrodes FE1 to FE10 in reverse order relative to one another. Thus, the 'first' display section (that is, the one coupled to the electrode FE1) in the group of sections 107a to 107k is the one, 107a, at the left-hand end (in FIG. 1) of that group; whereas the 'first' section in the next group of sections 107l to 107u, at the right-hand end (in FIG. 1) of that group. Similarly, in the group of sections 107v to 107e', the 'first' one is the section 107v, at the left-hand end. As can be seen in FIG. 2, this arrangement permits the electrodes FE1 to FE10 to interconnect all the sections 107 and 108 without crossing-over one another.

In the arrangement shown in FIG. 2, the section 109a of the water temperature gauge 103 is at the upper end of that gauge 103, whereas the corresponding section 110a of the fuel gauge 104 is at the lower end of the fuel gauge 104. This difference ensures that both gauges provide a display varying in length from the lower end upwards, as will be explained hereinafter.

Any one of the display sections 107 to 112 can be operated to provide a visual display by energizing the respective ones of the electrodes FE1 to FE10 and BE1 to BE16. Thus, for example, the section 107a is operated by energizing the electrodes FE1 and BE1; the section 108b' is operated by energizing the electrodes FE7 and BE8; and the section 112d of the odometer digit 106e is operated by energizing the electrodes FE4 and BE14.

Figure 3:
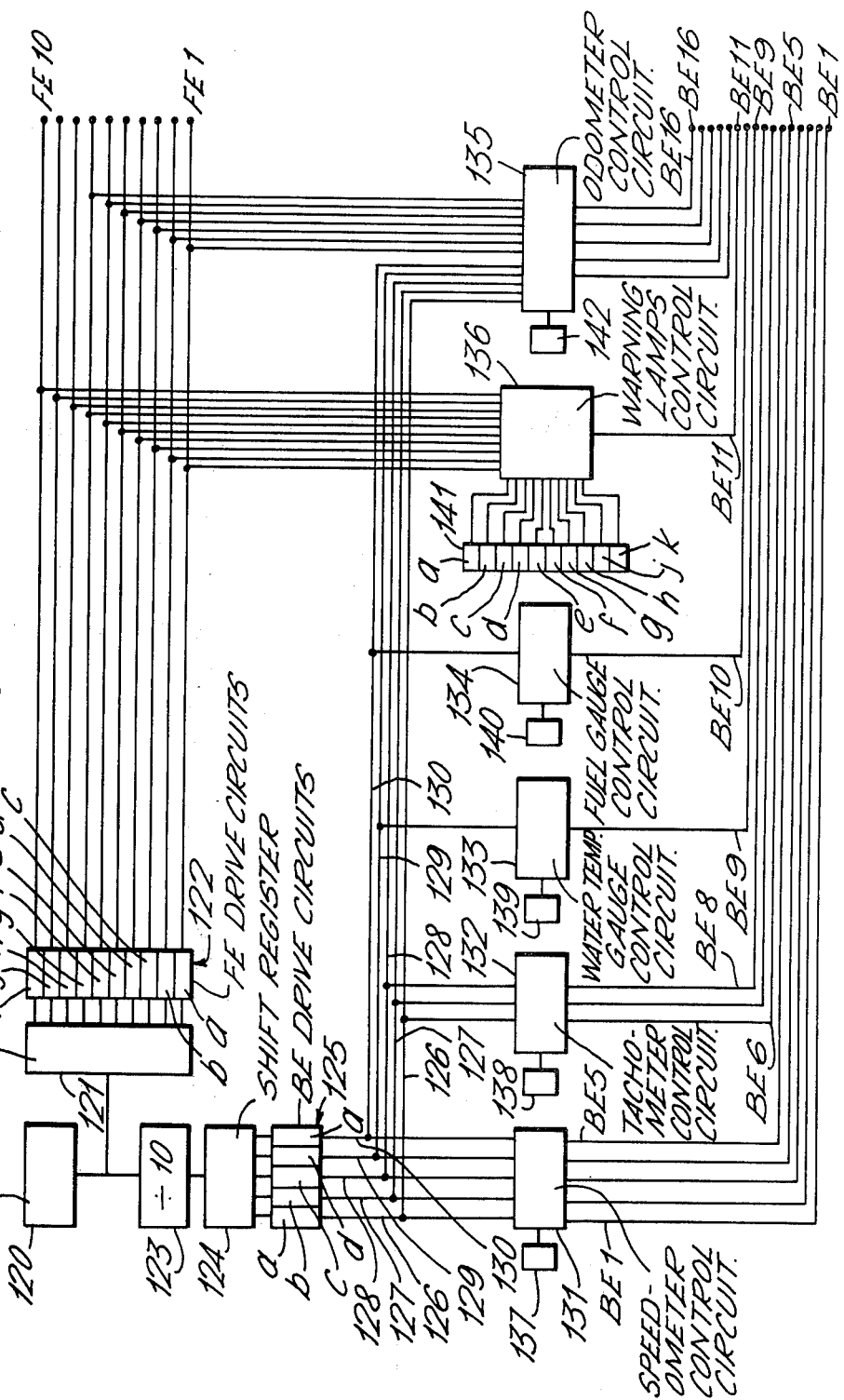
FIG. 3 is a block schematic diagram of a circuit for operating the displays shown in FIG. 1.

The energization of the electrodes FE1 to FE10 and BE1 to BE16 to provide appropriate indications on each display is controlled by the circuit shown in FIG. 3. This circuit energizes the electrodes FE1 to FE10 successively in a ten-step cycle, and simultaneously energizes selected ones of the electrodes BE1 to BE16 in a five-step cycle in accordance with the values of the respective parameters to be indicated. Each said step of the cycle of energization of the electrodes BE1 to BE16 lasts for a complete cycle of energization of the electrodes FE1 to FE10.

Referring to FIG. 3, an oscillator 120 supplies a pulse signal having a pulse repetition frequency of about 50 kHz (depending on the afterglow and life characteristics of the electroluminescent material used in the display panel) to a reversable shift register 121 which has ten stages each coupled to a respective one of ten FE drive circuits 122a to 122k. The shift register 121 is arranged to count the pulses supplied by the oscillator 120, in groups of ten, alternately forwards and backwards in a five-step cycle. Thus, for fifty successive pulses from the oscillator 120, the FE drive circuits 122 are operated in the forward order 122a to 122k during the first, third and fifth groups of ten pulses, and in the reverse order 122k to 122a during the second and fourth groups. The FE drive circuits 122a to 122k are coupled to the electrodes FE1 to FE10 respectively, so the electrodes FE1 to FE10 are energized in the sequence FE1-FE10, FE10-FE1, FE1-FE10, FE10-FE1, FE1-FE10; FE1-FE10 . . . and so on. This reversal of the order of energization after every ten pulses is required because of the mirror-image connection of adjacent groups of ten display sections 107 and 108 in the speedometer 101 and the tachometer 102.

The oscillator 120 also supplies the pulse signal via a divide-by-ten circuit 123 to a shift register 124 which has five stages each coupled to a respective one of five BE drive circuits 125a to 125e. These BE drive circuits 125a to 125e are coupled to five lines 126 to 130 respectively, and are operated by the shift register 124 to energize the lines 126 to 130 respectively. Thus each line 126 to 130 is energized for the duration of ten pulses from the oscillator 120, and the cycle of energization of all five lines 126 to 130 is repeated every fifty pulses, synchronously with the sequence of energization of the electrodes FE1 to FE10.

If the duration of one pulse from the oscillator 120 is regarded as defining one time period, the overall cycle-time of the circuit is fifty time periods. It will be seen that this number is equal to the number of display sections 107 in the largest display, namely the speedometer 101. Any one of the display sections 107 to 110 and 112 (FIG. 2) can be energized once only during one sequence of fifty time periods, and the display sections 111 (in the warning light cluster 105) may be energised five times during such a sequence. FIG. 4 shows the particular time period or periods in which any display section 107 to 112 may be energized by the repetitive energization of the electrodes FE1 to FE10 and the selective energization of the electrodes BE1 to BE16.

Considering one overall cycle of operation of the instrument panel, comprising five sequences of energization of the electrodes FE1 to FE10, the displays are illuminated, according to the magnitudes of the various parameters displayed, in the following manner:

| Time Periods | | |
|---|---|---|
| 1 to 10 | Speedometer | 107a to 107k |
| | Tachometer | 108a to 108k |
| | Warning Lights | 111a to 111k |
| | Odometer | 106a |
| 11 to 20 | Speedometer | 107l to 107u |
| | Tachometer | 108l to 108u |
| | Warning Lights | 111k to 111a |
| | Odometer | 106b |
| 21 to 30 | Speedometer | 107v to 107e' |
| | Tachometer | 108v to 108e' |
| | Warning Lights | 111a to 111k |
| | Odometer | 106c |
| 31 to 40 | Speedometer | 107g' to 107p' |
| | Water Temperature | 109a to 109k |
| | Warning LIghts | 111k to 111a |
| | Odometer | 106d |
| 41 to 50 | Speedometer | 107q' to 107z' |
| | Fuel | 110a to 110k |
| | Warning Lights | 111a to 111k |
| | Odometer | 106e |

Referring again to FIG. 3, there are five control circuits 131 to 135 which are selectively coupled to the lines 126 to 130 and are associated with, respectively, the speedometer 101, the tachometer 102, the water temperature gauge 103, the fuel gauge 104 and the odometer 106. A sixth control circuit 136 is provided for the warning light cluster 105.

The speedometer control circuit 131 is coupled to all five lines 126 to 130, and also to a transducer 137 mounted in the vehicle to sense, and provide an alternating signal having a frequency which varies in accordance with, the speed of rotation of the gearbox output shaft or the the roadwheels of the vehicle. The control circuit 131 is further coupled to the electrodes BE1 to BE5, and energizes them with the signals on the lines 126 to 130 in accordance with the frequency of the signal from the transducer 137.

The tachometer control circuit 132 operates in a similar manner to the speedometer control circuit 131 to energize the electrodes BE6 to BE8 with signals on the lines 126 to 128 in accordance with a signal generated by a transducer 138. This transducer 138 senses the speed of rotation of the crankshaft of the vehicle engine.

The water temperature gauge control circuit 133 is responsive to the signal from a temperature-sensitive transducer 139 to control the coupling of the signal of the line 129 to the electrode BE9, and the fuel gauge control circuit 134 operates similarly, in response to the signal from a fuel-level transducer 140, to control the coupling between the line 130 and the electrode BE10.

The warning light control circuit 136 has no connections to the lines 126 to 130, but instead is connected to receive signals from the electrodes FE1 to FE10. Ten transducers 141a to 141k, responsive to the various parameters indicated by the warning light cluster 105, supply signals to the control circuit 136 to enable it to control the coupling of the signals on the electrodes FE1 to FE10 to the electrode BE11.

A transducer 142 (which may be combined in a single unit with the transducer 137) supplies pulses to the odometer control circuit 135 at a frequency which varies in accordance with the speed of rotation of the vehicle wheels. The odometer control circuit 135 counts these pulses, and passes signals from the lines 126 to 130 to the electrodes BE12 to BE16, in synchronism with energization of the electrodes FE1 to FE7, so that the odometer 106 displays the current count.

The operation of the speedometer control circuit 131 will now be described in greater detail with reference to FIGS. 5 and 6.

Figure 5:
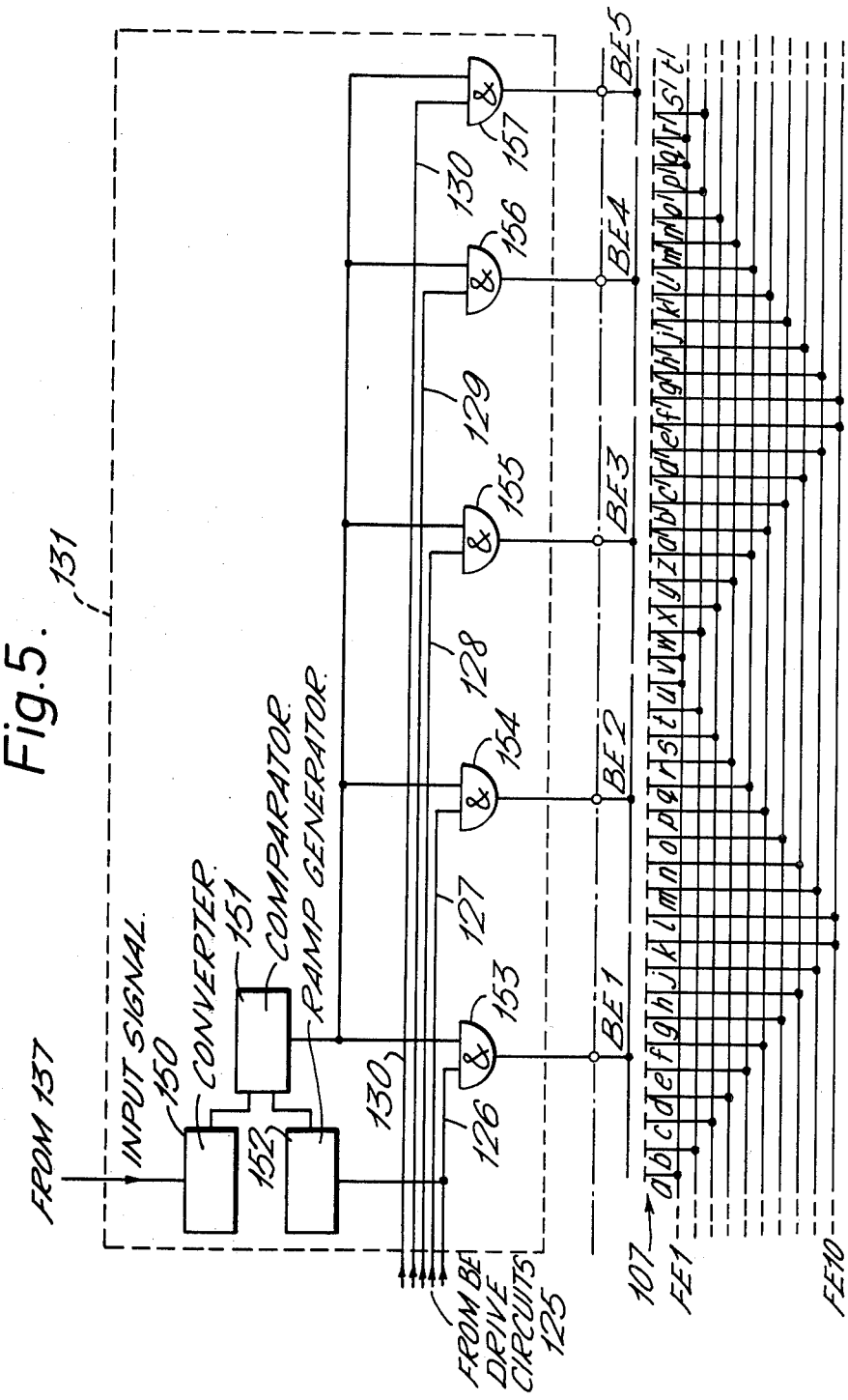
FIG. 5 is a block schematic diagram of a speedometer control circuit forming part of the circuit of FIG. 3.

Referring to FIG. 5, the speedometer control circuit 131 comprises a frequency-to-voltage converter 150, a comparator 151, a ramp generator 152 and five two-input AND-gates 153 to 157. The signal from the transducer 137 is fed to the converter 150, which supplies a voltage to one input of the comparator 151, the magnitude of the voltage being proportional to the frequency of the signal from the transducer 137. The other input of the comparator 151 is supplied with a rising ramp voltage by the ramp generator 152, which is coupled to the line 126 from the BE drive circuit 125a so that the start of the ramp voltage is triggered by the leading edge of a pulse on the line 126.

The output of the comparator 151 is connected to one input of each of the AND-gates 153 to 157, the outputs of which are coupled to respective electrodes BE1 to BE5. The other input of each AND-gate 153 to 157 is coupled to a respective one of the lines 126 to 130.

In the following description, and in FIG. 6, it is assumed that the speedometer 101 is indicating a speed of 42 miles per hour, which requires that the display sections 107a to 107v should be energized. As explained previously, the lines 126 to 130 are supplied with pulses by the BE drive circuits 125 at a rate ten times slower than the rate of energization of the electrodes FE1 to FE10. Accordingly, each line 126 to 130 in succession carries a pulse having a duration of ten time periods—see FIGS. 6(b) to 6(f).

The leading edge of the pulse on the line 126, at the start of time period 1, triggers the ramp generator 152, and this in turn causes the comparator 151 to provide a voltage at its output, as shown in FIG. 6(g). When the magnitude of the ramp voltage has increased up to the magnitude of the output voltage of the converter 150, the comparator 151 ceases to provide an output signal. The rate of increase of the ramp voltage is such that it reaches the maximum value (representing 100 miles per hour) of the output signal of the converter 150 after fifty time periods. Thus the duration of the output signal of the comparator 151 is proportional to the magnitude of the output signal of the converter 150, and to the speed of the vehicle. For a speed of 42 miles per hour, the output signal of the comparator 151 ends after twenty-one time periods, as shown in FIG. 6(g).

During the first ten time periods, the AND-gate 153 receives an input signal from both the line 126 and the comparator 151, so the electrode BE1 is energized—see FIG. 6(h). As described earlier, the electrodes FE1 to FE10 are also energized in sequence by the FE drive circuits 122 during these ten time periods. In consequence, the ten display sections 107a to 107k are illuminated, in that order during the time periods 1 to 10.

The AND-gate 154 receives two input signals, from the line 127 and the comparator 151, during the time periods 11 to 20, so that the electrode BE2 is energized (FIG. 6(j)) while the electrodes FE10 to FE1 are being energized in that order. This results in the display sections 107l to 107u being illuminated in succession.

The electrode BE3 is energized in the time period 21, via the AND-gate 155, along with the electrode FE1, thereby illuminating the display section 107v. However, as explained earlier, the output signal of the comparator 151 ceases at the end of the time period 21, and thereafter the AND-gate 155 receives only one input signal on the line 128, so that electrode BE3 becomes de-energised—see FIG. 6(k). Consequently, there is no illumination of the display sections 107w to 107e'.

Similarly, the AND-gates 156 and 157 receive no signal from the comparator 151 when they are receiving pulses on the lines 129 and 130 respectively, with the result that there is no energization of the electrodes BE4 and BE5, as shown in FIG. 6(l), and the display sections 107g' to 107z' are not illuminated. At the end of the pulse on the line 130 (that is, after the time period 50), the line 126 is re-energized and the sequence described above is repeated.

Since the pulse repetition frequency of the oscillator 120 is 50 kHz, each time period is 20 microseconds in duration, and one complete cycle of fifty time periods occupies 1000 microseconds. Consequently, the display sections 107a to 107v are each illuminated one thousand times per second, for 20 microseconds per time. The visible effect is a band of continuous illumination in the speedometer 101 extending from 0 to 42 miles per hour.

If the speed of the vehicle increases, the output signal from the converter 150 increases in magnitude, so that the output signal from the comparator 151 is present for a longer interval. Thus, the electrode BE3 is energized for more time periods after time period 21, and possibly the electrodes BE4 and BE5 are energized also, causing more of the display sections 107 to be illuminated. A decrease in speed results in a shorter signal from the comparator 151, and fewer display sections 107 are illuminated.

It should be noted that if the vehicle speed is not an integral multiple of two, the output signal of the comparator 151 will cease part-way through a time period. For example, at 77 miles per hour the signal will cease half-way through the time period 39. Consequently, the display section 107o' will be energised for only half the duration of the time period 39, and will appear to be illuminated at half the intensity of the preceding display sections 107a to 107n'.

The tachometer control circuit 132 is similar to the speedometer control circuit 131, except that, as there are only three electrodes BE6 to BE8 in the tachometer 102, the control circuit 132 contains only three AND-gates, coupled to the lines 126 to 128. The operation of the tachometer control circuit 132 is the same as for the speedometer control circuit 131, the display sections 108 being illuminated as appropriate during the time periods 1 to 30. FIG. 6(m) to (p), shows the waveforms which occur when the tachometer 102 is indicating an engine speed of 2600 revolutions per minute.

Although the water temperature gauge control circuit 133 and the fuel gauge control circuit 134 operate on the same principle as the speedometer control circuit 131, they are somewhat different in detail. This is because the water temperature gauge 103 and the fuel gauge 104 each have only ten display sections, so their respective electrodes BE9 and BE10 only need to be energized (if appropriate) during one group of ten time periods. Accordingly, there is no AND-gate in the control circuits 133 and 134, and the lines 129 and 130 are connected only to the respective ramp generators in these control circuits 133 and 134. The output of the comparator in each control circuit 133 and 134 is connected directly to the respective electrode BE9 or BE10. Thus, in the case of the water temperature gauge 103, the ramp generator is triggered at the start of the time period 31, and the ramp signal reaches its maximum value at the end of the time period 40. Therefore, the comparator can only produce an output signal in the interval defined by these time periods.

In addition, the converter in the control circuits 133 and 134 is a simple amplifier, since the signals from conventional water temperature and fuel senders (the transducers 139 and 140) are normally in the form of d.c. voltages. Consequently, the magnitudes of these signals merely need to be shifted to the appropriate level for operation of the comparators in the control circuits 133 and 134.

Figure 6:
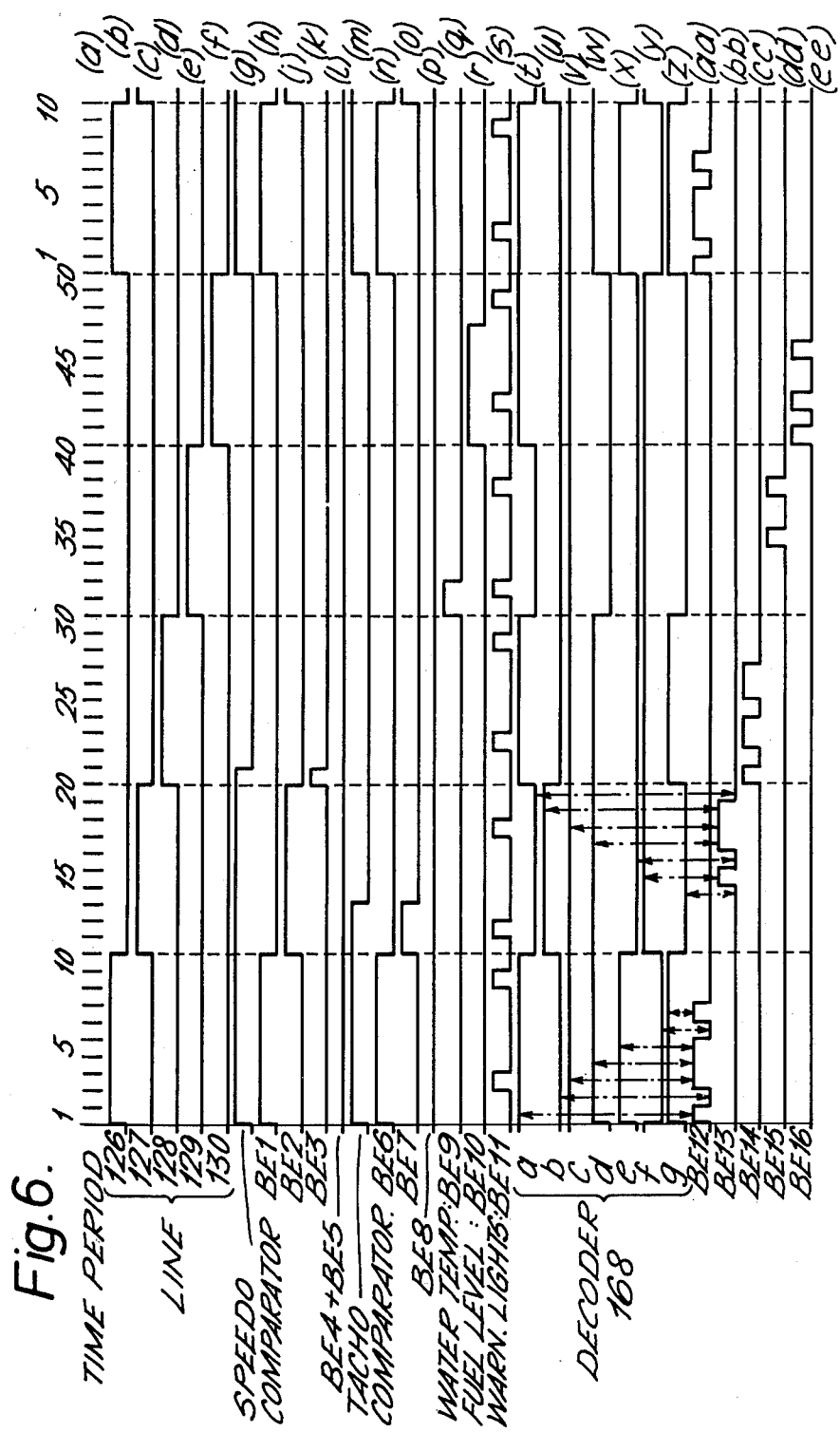
FIG. 6 is a waveform diagram of signals in the circuit of FIG. 3.

The waveforms generated when the water temperature gauge 103 is indicating a temperature between 'cold' and 'normal', and the fuel gauge 104 is indicating a fuel level slightly below three-quarters full, are shown in FIG. 6 at (q) and (r) respectively.

It should be noted that, although the electrodes FE1 the FE10 are energized in the reverse order for the water temperature gauge 103 and in the forward order for the fuel gauge 104, the inverted arrangement of the display sections 110 relative to the display sections 109, referred to earlier, compensates for this difference. Thus, both gauges 103 and 104 indicate their respective parameters by means of lines varying in length from the lower end upwards.

As has already been mentioned, the warning light cluster 105 is energized five times more often than the other displays, so that the display sections 111 appear brighter than the other display sections in the device, and thus attract particular attention when they are illuminated. Accordingly, each display section 111 is energized (when required) every time the respective electrode FE1 to FE10 is energized, so no connections between the warning light control circuit 136 and the lines 126 to 130 are required. Instead, the control circuit 136 contains ten two-input AND-gates, each of which responds to a respective one of the electrodes FE1 to FE10 and to a respective one of the transducers 141a to 141k. All the AND-gates can energize the electrode BE11. Thus, for example, when the transducer 141c is activated, the respective AND-gate energizes the electrode BE11 every time the electrode FE3 is energized, so the display section 111c is illuminated five thousand times per second. Similarly, the display section 111j is illuminated, when the transducer 141j is activated, every time the electrode FE9 is energized. The corresponding waveform on the electrode BE11 is shown in FIG. 6(s).

Figure 7:
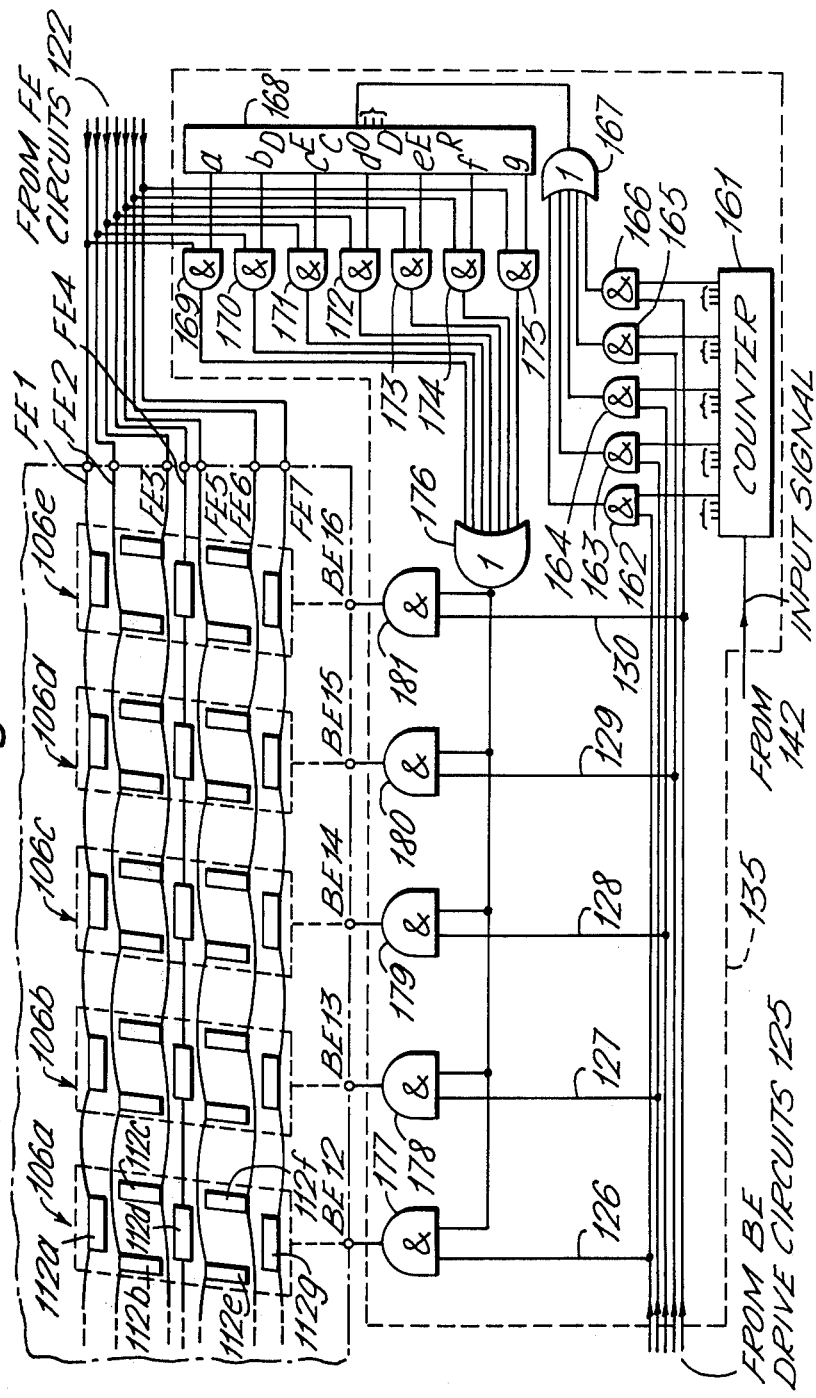
FIG. 7 is a block schematic diagram of an odometer control circuit forming part of the circuit FIG. 3.

Referring now to FIG. 7, the odometer control circuit 135 contains a counter 161 which counts the pulses supplied by the transducer 142. The output of the counter 161 comprises five groups of four signals each, which represent five decimal digits in binary-coded-decimal (B.C.D.) form. The least significant binary digit in each group is fed to a respective one of five two-input AND-gates 162 to 166 which also receive signals from respective ones of the lines 126 to 130. The outputs of the AND-gates 162 to 166 are connected to a five-input OR-gate 167 which supplies a signal to the least significant binary input of a B.C.D.-to-seven-segment decoder 168.

The next most significant binary digit in each group of outputs of the counter 161 is fed to a respective one of another group of AND-gates (not shown) which are connected, in the same manner as the AND-gates 162 to 166, to the lines 126 to 130 and to an OR-gate (not shown) which drives the next most significant binary input of the decoder 168. The remaining binary digit outputs of the counter 161 are coupled through similar groups (not shown) of five AND-gates and an OR-gate to the other two inputs respectively of the decoder 168. Thus, energization of any one of the lines 126 to 130 causes the B.C.D. signal from the corresponding one of the five groups of outputs of the counter 161 to be supplied to the decoder 168.

Each of the seven outputs of the decoder 168 is connected to one input of a respective one of two-input AND-gates 169 to 175, the other inputs of which are coupled to respective ones of the electrodes FE1 to FE7. The output signals of the AND-gates 169 to 175 are combined by a seven-input OR-gate 176, the output of which is connected to one input of each of five two-input AND-gates 177 to 181. The second input of each AND-gate 177 to 181 is coupled to a respective one of the lines 126 to 130, and their outputs drive respective ones of the electrodes BE12 to BE16.

During the time periods 1 to 10, the signal on the line 126 causes the AND-gate 162 and the associated three AND-gates in the other groups (not shown) to pass the B.C.D. signal (comprising four binary signals) representing the most significant decimal digit from the counter 161 to the decoder 168. The seven outputs of the decoder 168, labelled a to g, assume potentials which, when applied to the corresponding segments of a seven-segment display device, would generate a display of the appropriate decimal digit. When the electrode FE1 is energized, for example, the corresponding AND-gate 169 passes the signal from the output a of the decoder 168 via the OR-gate 176 to the AND-gates 177 to 181. Since only the line 126 is energized, only the AND-gate 177 can respond, and thereby energize the electrode BE12 (assuming the display section 112a of the odometer digit 106a is to be illuminated). When the electrode FE2, which is associated with the display sections 112b, is energized, then the signal from the output b of the decoder 168 is supplied to the electrode BE12, and so on. Thus the effect is rapidly to switch the energization of the electrode BE12 on and off in synchronism with the sequential energization of the electrodes FE1 to FE7, so that it is energized only when the electrodes FE1 to FE7 are energization those display sections 112 of the odometer digit 106a which are to be illuminated.

The signal on the line 127, in the time periods 11 to 20, causes the B.C.D. signal for the next least significant digit to be supplied to the decoder 168, and energizes one input of the AND-gate 170. Thus the output signals of the decoder 168 are now supplied in turn to the electrode BE13. Since the electrodes FE1 to FE7 are energized in reverse order during the second group of ten time periods, the display sections 112 of the odometer digit 106b are illuminated, as appropriate, in the order 112g to 112a.

The digits to be displayed by the odometer digits 106c to 106e are built up in the same way, by pulsed operation of the electrodes BE14 to BE16, when the corresponding one of the lines 128 to 130 is energized. FIG. 6 (t) to (z) shows the waveforms on the outputs a to g of the decoder 168 for displaying the decimal number '24317'. The resulting pulses of energization of the electrodes BE12 to BE16 are shown in FIG. 6(aa) to (ee). The relationship between these pulses and the output signals a to g of the decoder 168 from which they are derived is indicated, for the first two digits, by the arrows drawn in broken lines.

The counter 161 may be provided with a memory facility so that the total mileage travelled by the vehicle is retained irrespective of interruptions to the power supply to the instrument panel. It may also be arranged to provide on demand either a total mileage indicator, or an intermediate mileage indication which can be reset to zero at will.

Figure 8:
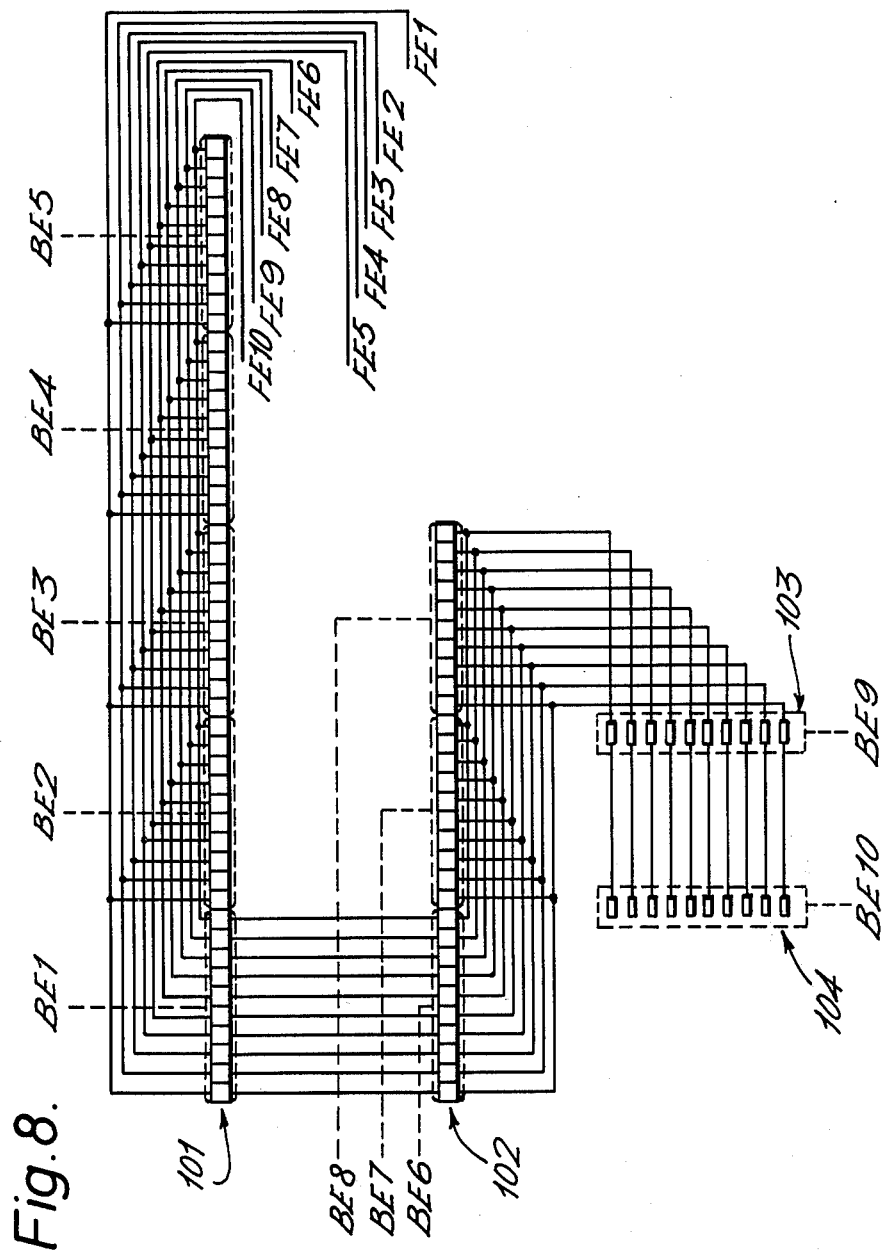
FIG. 8 shows an alternative pattern of electrodes for energizing some of the displays shown in FIG. 1.

Although the invention has been described, with particular reference to FIG. 2, to a pattern of front electrodes FE1 to FE10 which do not cross-over one another, it is visualized that the invention may include a pattern of front electrodes defining the display sections of the speedometer 101, the tachometer 102, the water temperature gauge 103 and the fuel gauge 104 where the electrodes cross-over one another. One such pattern of electrodes is shown in FIG. 8 where the adjacent groups of ten display sections 107 and 108 of the speedometer 101 and the tachometer 102 are interconnected by the electrodes FE1 to FE10 in the same order relative to one another. Thus, for example, in each of the groups of speedometer sections 107a to 107k, 107l to 107u, 107v to 107e', 107f' to 107p' and 107q' to 107z', the 'first' display sections of these groups of sections, that is, the sections 107a, 107l, 107v, 107f' and 107q', are each coupled to the electrode FE1, and the 'final' display sections, that is, the sections 107k, 107u, 107e', 107p' and 107z', are each coupled to the electrode FE10. Similarly, of the groups of tachometer sections 108a to 108k, 108l to 108u, and 108v to 108e', the 'first' display sections of these groups of sections, that is, the sections 108a, 108l, and 108v, are each coupled to the electrode FE1, and the 'final' display sections of these groups, that is, the sections 108k, 108u, and 108e', are each coupled to the electrode FE10.

Also, the display sections of the water temperature gauge 103 are disposed in the same order as the display sections of the fuel gauge 104 with the display sections of the water temperature gauge 103 being in the reverse order to that shown in FIG. 1 so that the display section 109a is at the lower end of that gauge and the display section 109k is at the upper end thereof.

The modified form of the electrodes FE1 to FE10 of FIG. 8 results in some change in the particular time period or periods during which any display section 107 to 110 may be energized by the repetitive energization of the electrodes FE1 to FE10 and the selective energization of the electrodes BE1 to BE10. A table of the modified time periods during which the display sections may be energized is shown in FIG. 9.

This modified form of the electrodes FE1 to FE10 of FIG. 8 permits these electrodes to be controlled by a somewhat simpler control circuit than that shown in FIG. 3. Such a control circuit is shown in FIG. 10 where the output pulses of the oscillator 120 are delivered to a divide-by-ten circuit 200 which supplies an output pulse to a divide-by-five circuit 201 in response to each tenth pulse from the oscillator 120. The divide-by-ten circuit 200 also responds to each group of ten pulses from the oscillator 120 and supplies via leads 202 to a decoder 203, coded signals which uniquely identify the pulses of each group of ten pulses. The decoder 203 decodes these signals and sequentially supplies to an FE drive circuit 204, during each group of ten oscillator pulses, the signals FE1 to FE10. These FE signals are always supplied in the order FE1 to FE10, with the signal FE1 being supplied in response to the first pulses of each group of ten oscillator pulses, the signal FE2 being supplied in response to the second pulses of any group of ten oscillator pulses, and so on.

The divide-by-five circuit 201 responds to each group of five pulses from the divide-by-ten circuit 200 and supplies via leads 205 coded signals which uniquely identify the pulses of each group of five pulses. Thus the divide-by-five circuit 201 sequentially supplies a group of five coded signals once during every fifty pulses from the oscillator 120, the divide-by-five circuit 201 supplying a first of its coded signals during the first ten oscillator pulses (that is, the first ten time periods), a second of its coded signals during the next ten oscillator pulses (that is, the eleventh to twentieth time periods), and so on.

The coded signals on the leads 205 are decoded by four decoders 206 to 209 which are capable of supplying respective ones of the BE signals via respective BE drivers 210 to 213 according to the magnitude of the respective parameters to be displayed. More particularly, the decoders 206 to 208 are arranged to supply respective groups of five BE signals, the signals BE1 to BE5, BE6 to BE10 and BE12 to BE16, respectively, and the decoder 209 is arranged to supply only the BE signal BE11, with the BE signals being supplied, according to the magnitudes of the respective parameters to be displayed, in the following time periods:

| Time Periods | BE Signals |
|---|---|
| 1 to 10 | 1,6,12 and 11 |
| 11 to 20 | 2,7,13 and 11 |
| 21 to 30 | 3,8,14 and 11 |
| 31 to 40 | 4,9,15 and 11 |
| 41 to 50 | 5,10,16 and 11 |

The decoders 206 to 209 are controlled by six control circuits 214 to 219, the decoders 206, 208 and 209 being controlled by, respectively, the speedometer control circuit 214, the odometer control circuit 218 and the warning lamp control circuit 219, while the decoder 207 is controlled by the tachometer control circuit 215, the water temperature gauge control circuit 216, and the fuel gauge control circuit 217.

The speedometer control circuit 214 controls the supply of the signals BE1 to BE5 in accordance with the frequency of an alternating signal which is supplied by a transducer 137 and which varies in accordance with the speed of the vehicle. Similarly the tachometer control circuit 215 controls the supply of the signals BE6 to BE8 in accordance with a signal generated by a transducer 138 and which varies in accordance with the speed of rotation of the vehicle engine.

The water temperature gauge control circuit 216 is responsive to a signal supplied by a transducer 139 representative of a water temperature and controls the generation of the signal BE9, and the fuel gauge control circuit 217 operates similarly, in response to a signal from a transducer 140 representative of fuel level, to control the supply of the signal BE10.

The warning lamp control circuit 219 is controlled by ten transducers 141, responsive to the various parameters to be indicated by the warning light cluster 105. This control circuit 219 is also controlled by the coded signals 202 and is arranged to supply the signal BE11 only during the periods when the FE signal or signals corresponding to the warning lights to be illuminated are being supplied with an FE signal.

A transducer 142 supplies pulses to the odometer control circuit 218 at a frequency which varies in accordance with the speed of rotation of the vehicle wheels. The odometer control circuit 218 counts these pulses and controls the generation of the signals BE12 to 16, in synchronism with the supply of the signals FE1 to FE7, so that the odometer 106 displays the correct count.

The foregoing embodiments of display apparatus embodying the invention have been given by way of example only and various modifications may be made to the embodiments described without exceeding the scope of the invention. For example, the number of display regions in the speedometer 101 may be eighty and be arranged in ten groups of eight. Furthermore, the display panel may be one incorporating liquid crystal rather than the electroluminescent material.

We claim:

1. Display apparatus for simultaneously displaying the values of a plurality of different physical parameters, said apparatus having a plurality of electrically-operable display regions which are to be operated respectively in accordance with said different physical parameters to display respectively the values of those physical parameters, the said display regions each comprising a plurality of display sections disposed in spaced array, an electrode which is common to all display sections in that display region, and a plurality of individual electrodes defining individual and respective ones of the display sections in that display region, the electrodes of the said plurality of individual electrodes associated with the display region for one of said physical parameters being coupled to respective ones of the said plurality of individual electrodes associated with another display region for another one of said physical parameters to form respective groups of electrodes which respectively interconnect display sections associated with different ones of said plurality of physical parameters, and circuit means comprising first means for energizing the said groups of electrodes in a repeated fixed sequence and second means for energizing the said common electrodes in synchronism with the number of the repetition of said fixed sequence in a display cycle, said second means including a plurality of individual control means at least two of which are operable during each repetition of said fixed sequence, each of said control means being associated with a respective one of said plurality of physical parameters and being operable to control the energization of the common electrodes of the display region appropriate to that physical parameter in accordance with an input signal representative of the value of the physical parameter.

2. Display apparatus according to claim 1 wherein said second means is operable to energize the said common electrodes in sequence.

3. Display apparatus according to claim 1 wherein the said circuit means is arranged to energize one of the said common electrodes only during predetermined ones of the sequential energizations of the said groups of electrodes and to energize at least one other of the common electrodes only during a different one of the sequential energizations of the said groups of electrodes.

4. Display apparatus according to claim 1 wherein the display apparatus comprises a plurality of said display regions to be operated in accordance with a first of the said physical parameters, and wherein the electrodes of the plurality of individual electrodes of one of the display regions to be operated in accordance with the first physical parameter are coupled to respective and individual ones of the said plurality of individual electrodes of at least one other display region to be operated in accordance with the said first physical parameter.

5. Display apparatus according to claim 4 wherein the circuit means includes means for energizing the common electrodes of the display regions to be operated in accordance with the said first physical parameter sequentially.

6. Display apparatus according to claim 4 wherein the display regions operable in accordance with the first physical parameter provide indications of respective and different magnitudes of that physical parameter.

7. Display apparatus according to claim 1 including a display region having display sections which are to be operated in accordance with a plurality of different physical parameters, the said plurality of individual electrodes being coupled to respective ones of the said pluralities of individual electrodes associated with the other display regions.

8. Display apparatus according to claim 1 including a plurality of said display regions for providing an alpha-numeric display of a sensed physical parameter.

9. Display apparatus according to claim 8 having individual and different display regions for the elements of the alpha-numeric display.

10. Display apparatus according to claim 8 wherein the plurality of individual electrodes associated with each of the said display regions of the alpha-numeric display are coupled to respective and individual ones of the pluralities of electrodes associated with the other display regions.

11. Display apparatus according to claim 8 wherein the said circuit means is arranged to energize the common electrodes associated with the display regions for providing the alpha-numeric display in sequence.

12. Display apparatus according to claim 8 wherein the alpha-numeric display is a digital display.

13. Display apparatus according to claim 1 wherein the apparatus comprises two sheets between which is sandwiched a layer of electrically-controllable display material, the said groups of electrodes and the said common electrodes being provided on the said sheets.

14. Display apparatus according to claim 13 wherein all of the said groups of electrodes are disposed on one of the said sheets and all of the said common electrodes are disposed on the other of the said sheets.

15. Display apparatus according to claim 13 wherein the said electrodes are provided on the surfaces of the sheets facing the display material.

16. Display apparatus according to claim 15 wherein the said one sheet carries conductive means electrically interconnecting the individual electrodes of the said pluralities of electrodes.

17. Display apparatus according to claim 1 wherein the display apparatus includes means for sensing the said physical parameters and deriving electric signals in accordance with the values of the said physical parameters.

* * * * *